United States Patent [19]
Hacke et al.

[11] 3,969,815
[45] July 20, 1976

[54] PROCESS FOR FORMING A THROUGH CONNECTION BETWEEN A PAIR OF CIRCUIT PATTERNS DISPOSED ON OPPOSITE SURFACES OF A SUBSTRATE

[75] Inventors: Hans-Jürgen Hacke, Munich; Robert Graf, Starnberg, both of Germany

[73] Assignee: Siemens Aktiengesellschaft, Berlin & Munich, Germany

[22] Filed: Aug. 19, 1974

[21] Appl. No.: 498,606

[30] Foreign Application Priority Data
Sept. 19, 1973 Germany............................ 2347217

[52] U.S. Cl................................... 29/625; 29/628; 174/68.5; 339/17 C
[51] Int. Cl.²......................................... B41M 3/08
[58] Field of Search................ 29/625, 628, 470.1, 29/475, 484, 488, 505; 174/68.5; 317/101 B; 219/85, 86, 162; 204/15, 23; 156/3, 6, 8, 10, 11, 16

[56] References Cited
UNITED STATES PATENTS

| | | | |
|---|---|---|---|
| 2,889,393 | 6/1959 | Berger............................ | 339/17 C X |
| 2,974,284 | 3/1961 | Parker............................ | 29/625 UX |
| 2,977,672 | 4/1961 | Telfer .................... | 29/625 |
| 3,037,265 | 6/1962 | Kollmeier .................... | 29/625 |
| 3,201,851 | 8/1965 | Stearns.................... | 174/68.5 X |
| 3,276,106 | 10/1966 | Bester et al.................... | 174/68.5 X |
| 3,315,133 | 4/1967 | Walker ............................ | 29/625 X |
| 3,335,489 | 8/1967 | Grant.................... | 29/628 |
| 3,337,711 | 8/1967 | Garscia.................... | 29/625 |
| 3,346,950 | 10/1967 | Schick .................... | 29/625 |
| 3,678,437 | 7/1972 | Vaden............................ | 174/68.5 X |

Primary Examiner—C.W. Lanham
Assistant Examiner—James R. Duzan
Attorney, Agent, or Firm—Hill, Gross, Van Santen, Steadman, Chiara & Simpson

[57] ABSTRACT

In a process of forming through connections between metal circuit patterns formed in layers on opposite surfaces of a substrate characterized by forming an aperture through the pair of layers and the substrate, increasing the diameter of the aperture in the substrate, compressing the portions of each metal layer, which portions are overhanging the increased aperture, towards each other and subsequently forming a connection between the compressed portions of the opposite metal layers. Preferably, the apertures are formed by a mechanical operation such as drilling or punching and the substrate aperture is enlarged or widened by a selective etching process without substantially increasing the size of the aperture through the overlying metal layers. The electrical connection may be formed by galvanically depositing metal on the compressed portions to electrically interconnect the two portions, by welding the two portions together, or by applying solder such as during soldering a lead of a component which was inserted into the aperture.

10 Claims, 8 Drawing Figures

PROCESS FOR FORMING A THROUGH CONNECTION BETWEEN A PAIR OF CIRCUIT PATTERNS DISPOSED ON OPPOSITE SURFACES OF A SUBSTRATE

BACKGROUND OF THE DISCLOSURE

Field of the Invention

The present invention is directed to a process for forming through connections to electrically interconnect two metal layers disposed on opposite surfaces of a substrate such as in a printed circuit board.

To achieve a basic reduction in the size of a printed circuit, the use of a printed circuit board having a circuit pattern applied on opposite surfaces of a substrate has been utilized and to interconnect portions of the two patterns on opposite surfaces of the substrate, a connection extending through the substrate have been provided. In addition to reducing the size of the circuit boards, the use of through contacts produces a plurality of additional advantages. For example, the through contacts firmly secure the circuit patterns of the metal layer onto the substrate and the joining of the leads from components to the circuit patterns formed in the layers is greatly improved by inserting the lead into the aperture of the through contact and soldering the lead to the circuit patterns.

For the production of through contacts, processes are known in which a combination of currentless or galvanic metal deposition and etching steps are employed. In these processes, a substrate of a base material which has a metal layer applied on opposite surfaces is cut to the desired shape. An aperture is formed through the substrate and the opposite surface metal layers, the surface of the aperture is subsequently sensitized and activated to render the surface conducting, metal is deposited on the surface of the aperture by a currentless metal deposition process. The metal layers are then coated with negative patterns of a galvano-resistant dye. The conductor paths and bores are now galvanically provided with a metal structure and a thin, etch resistant final surface is then applied. When the galvano-resistant dye has been removed, the uncovered metal coating is etched away to provide the circuit patterns on the surface of the substrate. Since the through contacts or connections and the conductor paths of the circuit patterns are protected by the etch resistant final surface, they are retained and uneffected by the etching process. Such a procedure was disclosed in a book by H. Schikarski Die gedruckte Schaltung, (The Printed Circuit) Telekosmos-Verlag, Stuttgard 1966, page 60. This known process which can be modified in various ways in expensive and requires a large outlay of money and labor because of the relatively large number of process steps required for the currentless metal deposition. Also, the metal deposited by the currentless deposition acts as a type of dividing surface between the metal layers on the substrate and the galvanically deposited metal. The currentless deposited metal has a lower degree of purity, has a lower ductility and has more poor mechanical qualities.

The problems which occur with the use of a currentless deposition are avoided in other known processes which draw or deform a portion of the metal coating on each surface of the substrate into the aperture and then electrically connecting the drawn coatings together. In German Offenlegungschrift No. 1,640,468, a process for the production of through contacts or connections in a circuit board is disclosed. In this process, a circuit card or board is placed on a hard base and at a predetermined point for the through connection, the overlying conducting metal layer is pierced with a pointed tool so that a portion of the metal layer is cold drawn into a hollow frustrum-shaped projection which penetrates through the base material of the substrate and touches the opposite metal layer. Then, an electrical conductive connection is established at the point of contact between the drawn portion and the opposite layer, for example, by a galvanic metal deposition in the cavity of the hollow frustrum-like projection. This known process is limited to specific thicknesses and materials for the base substrate. For example, if the materials of the substrate have an elastic reformation property, displacement of the base material can create tensions in the material, cracks and breaks in the through contacts or connections. Also, the surfaces of the non-deformed conducting layer which face the substrate cannot be cleaned or can be cleaned only in a poor fashion at the point of the through contact. This means that the reliability and mechanical stability of the through connection or contact is not always obtained.

In German Offlegungsschrift No. 1,814,805, a process is described for producing through connections. In this process, a substrate of base material is provided with a single metal layer on one side and is then provided with an aperture. Subsequently, a second metal layer is provided on the other surface of the substrate and is caused to adhere thereto by pressure and temperature. After the production of the conductor paths, the metal lining which was the last to be applied is pressed with eye-pointed needles or tools into the holes to form lugs which are turned over onto the lands of the first layer and soldered into position. Although the through contacts produced in this process are reliable and mechanically stable, their production requires considerable outlay in labor costs and is expensive. Also, it is not possible to use commercially available substrates which are provided with metal layers on both surfaces. Since the temperature used to apply the second layer may cause unavoidable warping of the substrate, the exact positioning of the connection may not be obtained.

U.S. Pat. No. 2,889,393, discloses a method or process of forming through contacts. In this process, a substrate of base material which is free from metal coatings or layers is perforated and then under the effect of pressure and temperature, metal layers are caused to adhere to both sides of the perforated base material. Then at the points of perforation, the portions of the metal layers which are overlying the perforations are deformed into the perforations and into projection with a shape of a frustrum so that they touch one another with a circular zone of contact. The completion of the electrical connection is formed by spot welding the bases of the projection or by providing holes in the circular contact zone and then galvanically depositioning a metal or applying a solder layer. The production of these through contacts or connections is again expensive in terms of effort and cost and it is not possible to use commercially available material provided with the metal layers on both surfaces. It is also difficult to find the apertures or perforations formed in the substrate after the application of the metal layers on opposite surfaces thereof. Also, the possibility of warping of the base material or substrate which would occur during the adhesion of the metal layers under the effect of temperature and pressure can cause considerable errors in the location of the through contacts.

SUMMARY OF THE INVENTION

The present invention is directed to a process for forming electrical connections through a substrate to interconnect circuit patterns on opposite surfaces thereof which process can utilize commercially available substrates of base materials which are provided with the metal coatings or layers on both surfaces and which process produces electrical connections in precisely given points, which connections are mechanically and electrically reliable. To accomplish these tasks, the process includes forming an aperture having a diameter through the substrate and the metal layers on opposite surfaces of the substrate, increasing the diameter of the aperture in the substrate to produce an enlarged aperture with an overlying portion of the metal layer providing unsupported annular portions, compressing or deforming the annular portions of the layer toward each other into the enlarged aperture and then forming an electrical connection between the annular portions by either welding the portions together, by soldering or by galvanically depositing material.

DESCRIPTION OF THE PREFERRED EMBODIMENTS

Figure 5:
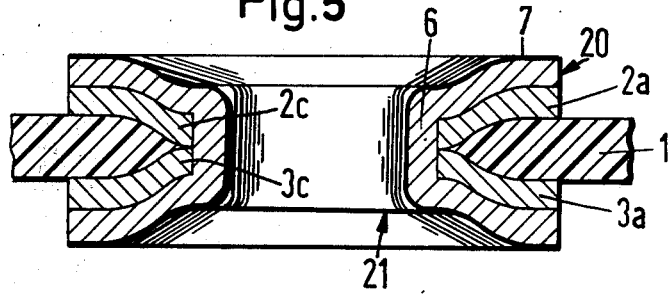
FIG. 5 illustrates the electrical connection of FIG. 4 after removal of the undesirable portions of the metal layers.

The principles of the present invention are particularly useful in forming a circuit board generally indicated at 20 in FIG. 5. The circuit board 20 comprises a substrate 1 of base material having an electrical connection or through contact generally indicated at 21 interconnecting portions of circuit patterns 2a and 3a on opposite surfaces of a substrate 1.

To form the circuit board 20 in FIG. 5, a starting blank comprising a substrate 1 with metal layers 2 and 3 on opposite surfaces thereof is utilized. Such a starting blank may be commercially available blank having copper metal layers 2 and 3 already provided on the substrate or board 1. The blank of FIG. 1 has an aperture 22 formed therein preferably by either a boring process or punching process. The aperture 22 extends through the copper metal layers 2 and 3 and the substrate 1. During the second step of the process, the diameter of the aperture 22 in the substrate 1 is increased or widened to form an increased aperture 23 while substantially maintaining the diameter of the aperture in each of the copper layers 2 and 3. A preferred method of forming the enlarged aperture 23 is by a selective etching process which selectively etches the material of the substrate 1 without substantially etching the copper layers 2 and 3 and which etching process is an etch back to expose adjacent surfaces of the layers 2 and 3 to form annular or ring-like portions 2b and 3b overlying the enlarged aperture 23. The selection of the etching solution will be in accordance with the particular material of the substrate 1. For example, in the case of polyester and epoxide resins, a sulpheric acid solution is utilized and in the case of the substrate 1 being a polyamide, a caustic soda solution will be utilized.

Figure 3:
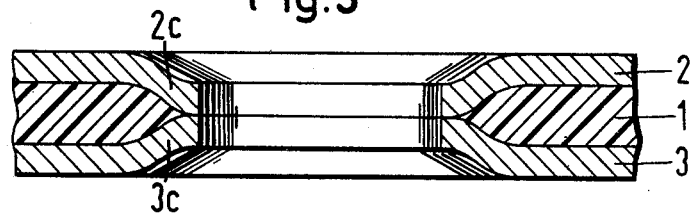
FIG. 3 is a cross-sectional view of the depressed annular portions of the layers in accordance with the present invention.

After completing the step of enlarging or widening of the aperture in the substrate to form the enlarged aperture 23, the annular portions 2b and 3b of the copper layers 2 and 3, which overlie the enlarged aperture 23 are deformed or compressed towards each other to form deformed annular portions 2c and 3c (FIG. 3). The portions 2c and 3c are deformed either into close proximity to each other or into contact with each other. The step of compressing or deforming may be accomplished by utilizing a pair of rams which are moved together in the region of the enlarged aperture 23 and form the depressed or deformed portions 2c and 3c and also compresses or deforms a portion of the substrate 1 adjacent the aperture 23. Instead of utilizing a pair of rigid rams for compressing the annular portions together, the substrate 1 with the copper layers 2 and 3 may have a pair of elastic pads or plates placed on the copper surfaces 2 and 3 and the assembly placed between a pair of platens which apply pressure to the pads to deform the portions 2b and 3b into portions 2c and 3c. Regardless of the manner of deforming the annular portions, the deformation of the portions 2c and 3c is a permanent deformation.

Figure 4:
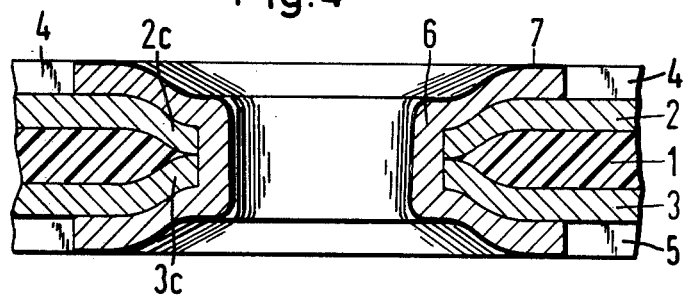
FIG. 4 is a cross-sectional view of a through connection in accordance with the present invention.

The remaining process steps for the production of the electrical connection or number of electrical connections, depending on the number of apertures, may be simultaneously employed with the process of producing the particular circuit pattern such as 2a and 3a (FIG. 5). Preferably, coverings 4 and 5 are applied on the layers 2 and 3 while leaving the portions of the layers 2 and 3 adjacent the deformed portions 2c and 3c unexposed. After the application of the coverings 4 and 5, the uncovered regions are coated by a galvanic metal deposition with a copper layer 6 followed by a thin layer 7 which is preferably a tin layer (FIG. 4). Any gaps between the deformed or compressed portions 2c and 3c of the layers 2 and 3 are closed by a bead formation of the deposited layer 6.

After forming the metal deposit 6 which is covered with the thin tin layer 7, the galvanic coverings or coatings 4 and 5 are removed and the undesired regions of the copper layers 2 and 3 are removed by an etching process. The etching process uses an etching solution which does not readily attack the tin layer 7 or any etch resistant material which was applied on the layers 2 and 3 to form the circuit patterns such as 2a and 3a of FIG. 5.

Figure 1:
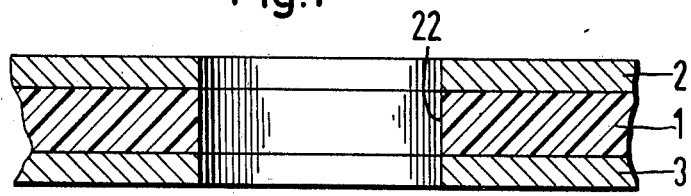
FIG. 1 is a cross-sectional view of a substrate provided with metal layers and having an aperture through the layers and substrate.
Figure 2:
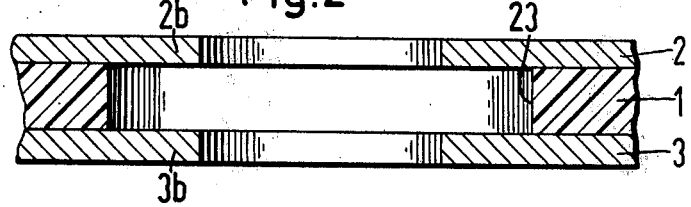
FIG. 2 is a cross-sectional view of an enlarged aperture in the substrate in accordance with the present invention.
Figure 6:
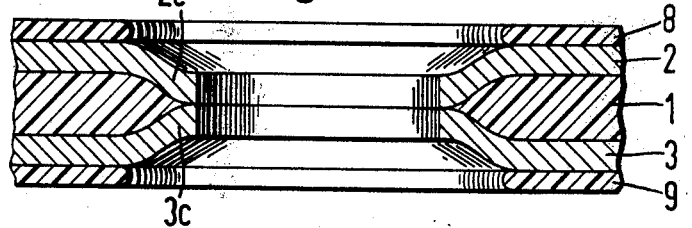
FIG. 6 is a cross-sectional view of an embodiment of the process of the present invention for forming the electrical connection.
Figure 7:
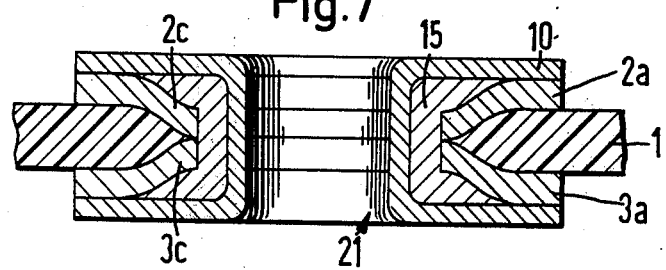
FIG. 7 is a cross-sectional view of the through connection formed by the embodiment of FIG. 6.

A variation or embodiment of the process is illustrated in FIGS. 6 and 7 and utilizes the initial steps illustrated in FIGS. 1, 2 and 3. After obtaining the configuration illustrated in FIG. 3 by deforming the annular portions 2b and 3b of the layers 2 and 3 to obtain the deformed portions 2c and 3c, lacquer layers or coatings 8 and 9 are applied by means of a roller on the copper layers 2 and 3. As illustrated in FIG. 6, the roller coating operation covers a surface of the copper layers 2 and 3 adjacent to the portions 2c and 3c but does not cover the dish-shaped recesses formed by deformed portions 2c and 3c which extend into the enlarged aperture. After applying the coatings 8 and 9, a copper layer 15 is galvanically applied to the region of the holes which are uncovered by the lacquer coatings 8 and 9. After applying the copper layers 15, the lacquer coatings 8 and 9 are removed and a negative conductor pattern is applied by a printing process, and a tin thin layer 10 is galvanically deposited onto the desired portions of the copper layers 2 and 3, which portions will form the conductor paths of the circuit pattern and on the layer 15 of the through contact or connection. The undesired regions of the copper layers 2 and 3 are removed by an etching process with the etching solution selected to etch the unexposed copper while the tin layer 10 acts as an etch resistant protection on the portions of the conductor paths and the layer 15. If necessary, prior to the application of the tin layer 10, the copper layer 15 may be smoothed off so it forms a plane with the copper layers 2 and 3 as illustrated in FIG. 7.

Figure 8:
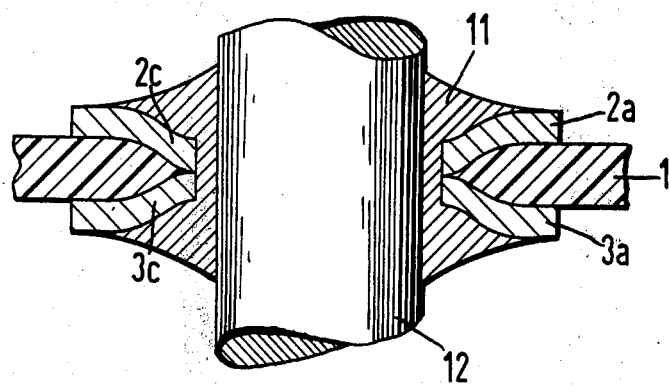
FIG. 8 is a cross-sectional view with portions in elevation for purposes of illustration illustrating another embodiment of the process for forming the electrical connection.

In FIG. 8 another embodiment of the process is illustrated. In this embodiment, a circuit board having the overlying portions 2b and 3b of the copper layers 2 and 3 are deformed into the enlarged apertures to form deformed portions 2c and 3c (FIG. 3) in accordance with the process. Then, a positive conductor pattern is applied to the copper layers 2 and 3 and the undesired regions are removed by etching with an etching solution. The actual electrical connection between the layers 2 and 3 is achieved when a component is attached to the printed circuit. For example, a layer of solder 11 connects the deformed portions 2c and 3c of the copper layers 2 and 3 as a lead 12 of the component which lead extends through the aperture is electrically connected into the circuit patterns 2a and 3a.

A special advantage of the process including the above mentioned embodiments is that a reliable mechanically stable electrical connection can be produced. In the embodiments of the process described which are illustrated in FIGS. 1–7, the formation of the electrical connection can be accomplished with the production of the electrical conductive circuit patterns such as 2a and 3a. An advantage of the process including the embodiments illustrated in FIGS. 6–8 is that the enlarging of the aperture and the substrate is accomplished by a selective etching process which produces the annular unsupported portions 2b and 3b in each of the metal layers 2 and 3. This process is easily utilized in a mass production of printed circuits with a large number of through contacts or connections, extending between the circuit patterns or portions of the circuit patterns which are on opposite surfaces of a substrate 1.

Although various minor modifications may be suggested by those versed in the art, it should be understood that we wish to employ within the scope of the patent granted hereon, all such modifications as reasonably and properly come within the scope of our contribution to the art.

We claim:

1. In a process for making a circuit board having a substrate with metal circuit patterns on each side with at least one connection extending through the substrate to electrically interconnect portions of the circuit patterns on opposite sides of the substrate by providing a substrate with metal conducting layers on opposite surfaces, removing portions of the metal layers to form the metal circuit patterns on opposite sides of the substrate, and forming at least one through connection to electrically connect portions of the metal circuit patterns on opposite sides of the substrate, the improvement comprising the steps of forming the through connection comprising forming an aperture having a diameter through the substrate and the metal layers on opposite sides of the substrate, increasing the diameter of the aperture in the substrate to produce an enlarged aperture with the overlying portions of the metal layers providing unsupported annular portions, deforming the unsupported annular portions of the layers towards each other into the enlarged aperture, and subsequently forming an electrical connection between the deformed annular portions.

2. In a process according to claim 1, wherein the step of forming the electrical connection comprises galvanically depositing metal on the deformed annular portions to complete the connection.

3. In a process according to claim 1, wherein the step of forming the connection between the deformed annular portions comprises welding the deformed annular portions together.

4. In a process according to claim 1, wherein the step of forming the electrical connection comprises soldering the deformed annular portions together.

5. In a process according to claim 1, wherein the step of enlarging the diameter of the aperture includes applying an etching solution to selectively etch the substrate without substantial etching of the metal layers.

6. In a process according to claim 5, wherein the step of forming the electrical connection between the deformed annular portions comprises galvanically depositing metal on the deformed portions.

7. In a process according to claim 5, wherein the step of forming the electrical connection between the deformed annular portions of the metal layer comprises welding the deformed portions together.

8. In a process according to claim 5, wherein the step of forming the electrical connection between the deformed annular portions comprises applying solder.

9. In a process according to claim 1, wherein the step of increasing the diameter of the aperture in the substrate increases the diameter of a sufficient distance so that the subsequent step of deforming the unsupported annular portions deforms the portions into engagement with each other.

10. In a process according to claim 9, wherein the step of forming the connection between the deformed annular portions comprises galvanically depositing metal on the engaged deformed annular portions to complete the connection.

\* \* \* \* \*